US008895863B2

(12) United States Patent
Inaba et al.

(10) Patent No.: US 8,895,863 B2
(45) Date of Patent: Nov. 25, 2014

(54) MULTILAYER PRINTED CIRCUIT BOARD

(71) Applicant: Denso Corporation, Kariya, Aichi-pref. (JP)

(72) Inventors: Masashi Inaba, Toyota (JP); Akito Itou, Kariya (JP)

(73) Assignee: DENSO CORPORATION, Kariya (JP)

( * ) Notice: Subject to any disclaimer, the term of this patent is extended or adjusted under 35 U.S.C. 154(b) by 153 days.

(21) Appl. No.: 13/726,827

(22) Filed: Dec. 26, 2012

(65) Prior Publication Data

US 2013/0168136 A1    Jul. 4, 2013

(30) Foreign Application Priority Data

Dec. 28, 2011 (JP) ................................. 2011-287635

(51) Int. Cl.
| | |
|---|---|
| H05K 1/00 | (2006.01) |
| H05K 1/16 | (2006.01) |
| H05K 1/11 | (2006.01) |
| H05K 1/18 | (2006.01) |
| H05K 1/02 | (2006.01) |

(52) U.S. Cl.
CPC ............ *H05K 1/0201* (2013.01); *H05K 1/0206* (2013.01); *H05K 1/0207* (2013.01); *H05K 2201/10166* (2013.01); *H05K 2201/10969* (2013.01)
USPC ............ 174/252; 174/260; 174/262; 361/761

(58) Field of Classification Search
CPC .......... H05K 1/185; H05K 2201/0195; H05K 3/4614; H05K 2201/09045; H05K 2203/068; H05K 2201/09018; H05K 3/4626; H05K 1/186; H05K 3/4069; H05K 3/4635; H05K 2201/0129; H01L 21/4857; H01L 23/13
USPC ........................... 174/252, 262, 260; 361/761
See application file for complete search history.

(56) References Cited

U.S. PATENT DOCUMENTS

| | | | | |
|---|---|---|---|---|
| 5,500,785 | A | * | 3/1996 | Funada .......................... 361/720 |
| 6,441,312 | B1 | * | 8/2002 | Tanimura et al. ............. 174/252 |
| 2002/0050380 | A1 | | 5/2002 | Tanimura et al. |

FOREIGN PATENT DOCUMENTS

| | | |
|---|---|---|
| JP | 07-045745 A | 2/1995 |
| JP | 9008482 A | 1/1997 |

(Continued)

OTHER PUBLICATIONS

English Machine version of JP2008270683A.*

(Continued)

*Primary Examiner* — Tuan T Dinh
*Assistant Examiner* — Ahmad D Barnes
(74) *Attorney, Agent, or Firm* — Posz Law Group, PLC

(57) ABSTRACT

A multilayer printed circuit board includes an insulating substrate, circuit layers arranged in the insulating substrate, an electronic component, an electrode disposed on the circuit layer exposed from a surface of the insulating substrate and including a soldered portion at which a terminal of the electronic component is soldered, an internal layer conductor disposed on the circuit layer located inside the insulating substrate and defining through holes in a radial manner centering on the soldered portion, a heat releasing conductor disposed on the circuit layer next to the circuit layer on which the internal layer conductor is disposed, and connection vias inserted in the through holes and coupling the electrode and the heat releasing conductor so as to enable a heat transfer between the electrode and the heat releasing conductor. The internal layer conductor and the heat releasing conductor overlap a whole area of the soldered portion.

8 Claims, 5 Drawing Sheets

(56) References Cited

FOREIGN PATENT DOCUMENTS

| | | |
|---|---|---|
| JP | 09-283700 A | 10/1997 |
| JP | 2005-123432 A | 5/2005 |
| JP | 2005-191435 A | 7/2005 |
| JP | 2006-049412 A | 2/2006 |
| JP | 2008-130684 A | 6/2008 |
| JP | 2008-270683 A | 11/2008 |
| JP | 2009-135391 A | 6/2009 |
| JP | 2011-053981 A | 3/2011 |

OTHER PUBLICATIONS

Information Statement mailed Feb. 10, 2014 in the corresponding JP application No. 2011-287635 (and English translation).
Office Action mailed Jan. 14, 2014 issued in corresponding JP patent application No. 2011-287635 (and English translation).
Office Action mailed Sep. 24, 2014 issued in corresponding JP patent application No. 2011-287635 (and English translation).

\* cited by examiner

MULTILAYER PRINTED CIRCUIT BOARD

CROSS REFERENCE TO RELATED APPLICATIONS

The present application is based on and claims priority to Japanese Patent Application No. 2011-287635 filed on Dec. 28, 2011, the contents of which are incorporated in their entirety herein by reference.

TECHNICAL FIELD

The present disclosure relates to a multilayer printed circuit board.

BACKGROUND

Conventionally, in a multilayer printed circuit board in which an electronic component is mounted, various structures for releasing heat generated from the electronic component has been suggested. For example, heat generated from an electronic component is released outside from an electrode (land) that is directly coupled to the electronic component. In another example, an electrode is coupled with a case that houses a multilayer circuit board therein to release heat to outside. In other words, heat generated from the electronic component is released to air from a surface of the case through the electrode. The case is generally set at a ground potential. However, depending on a type of the electronic component, an electrode may have a potential (for example, a positive potential) different from the ground potential. In this case, the electrode and the case at the different potentials cannot be coupled.

In order to solve the above-described issue, JP-A-2008-130684 discloses that an internal layer heat-transfer conductor is disposed in a multilayer printed circuit board so as to overlap a surface heat-transfer conductor (first electrode). In this method, heat generated from an electronic component is transferred from the surface heat-transfer conductor to the internal layer heat-transfer conductor through an insulating substrate. Then, the heat is transferred to a case or the insulating substrate that forms the multilayer printed circuit board and is released to outside.

In the above-described method, heat transfer from the surface heat-transfer conductor to the internal layer heat-transfer is performed between planes opposite to each other through the insulating substrate. In general, a thermal conductivity of an insulating substrate is smaller than a thermal conductivity of metal. For example, a thermal conductivity of prepreg, which is often used as an insulating substrate, is $4.40 \times 10^{-4}$ W/(mm·K), which is about $1/1000$ of thermal conductivity $4.01 \times 10^{-1}$ W/(mm·K) of copper. In other words, a heat transfer performance from the surface heat-transfer conductor to the internal layer heat-transfer conductor is low. As a method of improving the heat transfer performance from the surface heat-transfer conductor to the internal layer heat-transfer conductor, opposing areas of the surface heat-transfer conductor and the internal layer heat-transfer conductor through the insulating substrate may be increased. However, when the area of the surface heat-transfer conductor increases, the number of components mounted on the multilayer printed circuit board may decrease, a dimension of the multilayer printed circuit board may increase, and a cost may increase.

SUMMARY

It is an object of the present disclosure to provide a multilayer printed circuit board that can improve a heat releasing performance of heat generated from an electronic component without increasing an area of an electrode disposed on a surface of a substrate.

A multilayer printed circuit board according to an aspect of the present disclosure includes an insulating substrate, a plurality of circuit layers, an electronic component, an electrode, an internal layer conductor, a heat releasing conductor, and a plurality of connection vias.

The insulating substrate is made of an insulating base material and has a first surface and a second surface opposite to each other. The circuit layers are arranged in the insulating substrate in a thickness direction of the insulating substrate. The electronic component includes a terminal. The electrode is disposed on one of the circuit layers exposed from the first surface of the insulating substrate and includes a soldered portion at which the terminal of the electronic component is soldered.

The internal layer conductor is disposed on one of the circuit layers located inside the insulating substrate. The internal layer conductor has a potential different from a potential of the electrode. The internal layer conductor overlaps a part of the electrode. The internal layer conductor defines a plurality of through holes in a radial manner centering on the soldered portion in a plane perpendicular to the thickness direction.

The heat releasing conductor is disposed on one of the circuit layers next to the circuit layer on which the internal layer conductor is disposed. The circuit layer on which the heat releasing conductor is disposed is different from the circuit layer on which the electrode is disposed. The heat releasing conductor overlaps a part of the internal layer conductor.

The connection vias are inserted in the through holes through the insulating base material, and couples the electrode and the heat releasing conductor so as to enable a heat transfer between the electrode and the heat releasing conductor. The internal layer conductor and the heat releasing conductor overlap a whole area of the soldered portion of the electrode.

In the multilayer printed circuit board, the connection vias are disposed in the radial manner centering on the soldered portion. The heat generated from the electronic component and transferred from the electrode to the heat releasing conductor can be dispersed substantially uniformly in the radial manner. Thus, the multilayer printed circuit board can improve a heat releasing performance of the heat generated from the electronic component without increasing an area of the electrode.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION

First Embodiment

Figure 1:
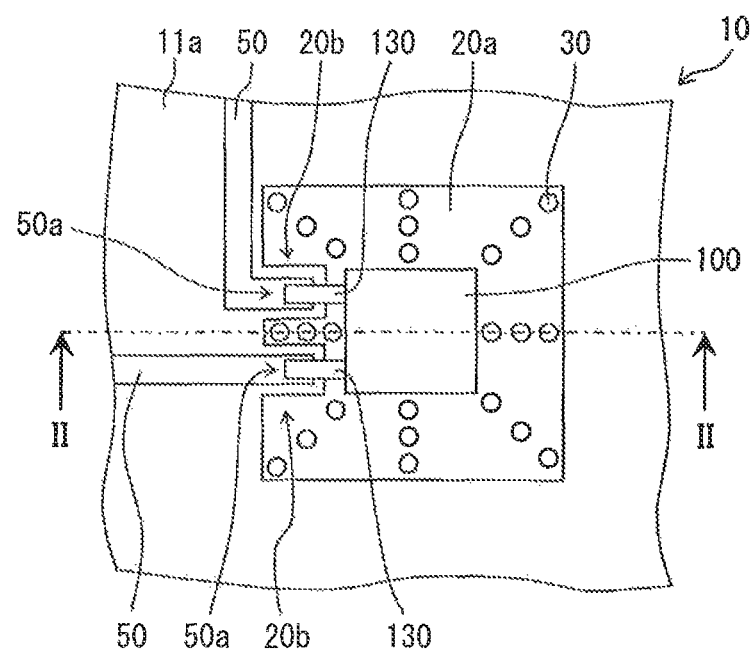
FIG. 1 is a top view showing a multilayer printed circuit board according to a first embodiment of the present disclosure.

A multilayer printed circuit board 10 according to a first embodiment of the present disclosure will be described with reference to FIG. 1.

Figure 2:
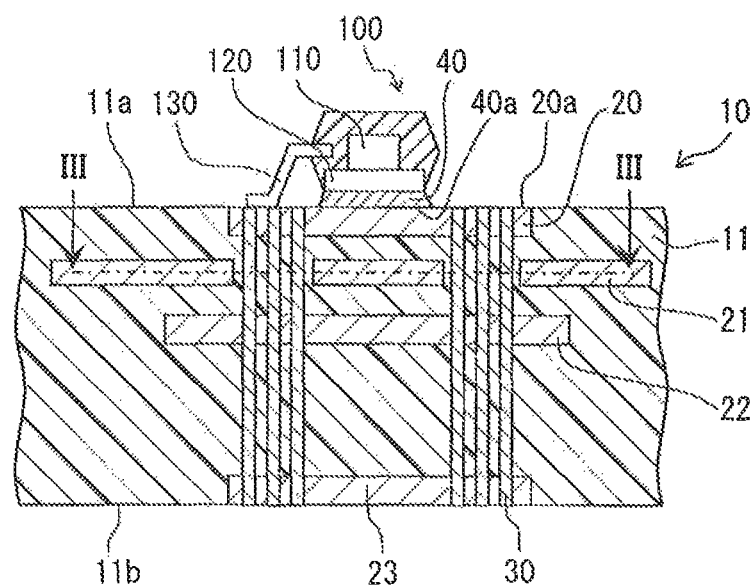
FIG. 2 is a cross-sectional view of the multilayer printed circuit board taken along line II-II in FIG. 1.

The multilayer printed circuit board 10 includes an insulating substrate 11. The insulating substrate 11 is formed by integrating a plurality of layers made of insulating base material such as prepreg. In the insulating substrate 11, a plurality of circuit layers is arranged in a thickness direction of the insulating substrate 11. The insulating substrate 11 has a first surface 11a and a second surface 11b opposite to each other. The multilayer printed circuit board 10 includes a first electrode 20 made of, for example, copper. The first electrode 20 is disposed on a circuit layer exposed from the first surface 11a of the insulating substrate 11 and has a surface 20a exposed from the first surface 11a. As shown in FIG. 2, inside the insulating substrate 11, an internal layer conductor 21 made of, for example, copper is disposed on a circuit layer next to the circuit layer on which the first electrode 20 is disposed. In the present embodiment, the internal layer conductor 21 overlaps the whole area of the first electrode 20. On a circuit layer next to the internal layer conductor 21 and opposite from the circuit layer on which the first electrode 20 is disposed, a heat releasing conductor 22 made of, for example, copper is disposed. In a manner similar to the internal layer conductor 21, the heat releasing conductor 22 overlaps the whole area of the first electrode 20. On a circuit layer exposed from the second surface 11b of the insulating substrate 11, a third electrode 23 made of, for example, copper is disposed. The third electrode 23 has a surface exposed from the second surface 11b. As shown in FIG. 2, the first electrode 20, the heat releasing conductor 22, and the third electrode 23 are electrically coupled with each other through connection vias 30 so that heat can be transferred among the first electrode 20, the heat releasing conductor 22, and the third electrode 23.

The first electrode 20 is disposed on the circuit layer exposed from the first surface 11a of the insulating substrate 11. On the surface 20a of the first electrode 20, an electronic component 100 may be mounted. For example, the electronic component 100 may be a three-terminal transistor. As shown in FIG. 2, the electronic component 100 includes an element 110, a rear electrode 120, and leads 130. The rear electrode 120 can operate as a heat releasing plate. The leads 130 are electrically coupled with an external circuit. The element 110, the rear electrode 120 and the leads 130 are molded with thermosetting resin, such as epoxy resin. The electronic component 100 is molded in such a manner that a surface of the rear electrode 120 is exposed from the thermosetting resin. The surface of the rear electrode 120 is soldered at a soldered portion 40a in the surface 20a of the first electrode 20 with a solder 40. As shown in FIG. 1, the leads 130 are electrically coupled with contact portions 50a of second electrodes 50. The second electrodes 50 are disposed on the circuit layer on which the first electrode 20 is disposed and are exposed from the first surface 11a of the insulating substrate 11. The first electrode 20 has two depressions 20b at an outer peripheral portion. In the present embodiment, the second electrodes 50 extend from outside the first electrode 20 to inside the depressions 20b. The leads 130 are coupled with the contact portions 50a in the second electrodes 50 located inside the depressions 20b. The electronic component 100 may be the three-terminal transistor in which the rear electrode 120 is an emitter and the two leads 130 coupled with the second electrode 50 are a collector and a base. An area of a surface of the first electrode 20 being perpendicular to the thickness direction is not limited and can be set optionally based on a dimension of a component mounted on the first surface 11a or a usage condition. When the area of the first electrode 20 is small, a mounting ratio of components on the insulating substrate 11 can be improved.

The second electrodes 50 are disposed on the circuit layer same as the first electrode 20. The contact portions 50a in the second electrodes 50 are located inside the depressions 20b. As a configuration of coupling the second electrodes 50 with an external circuit and the like, which is not shown, the second electrodes 50 may be coupled with wirings in the insulating substrate 11 using vias Although it is not shown in the drawings, a solder resist is applied to the first surface 11a of the insulating substrate 11, a portion in the surface 20a of the first electrode 20 other than the soldered portion 40a, and portions of the second electrode 50 other than the contact portions 50a. In other words, the solder resist covers a region in a surface of the multilayer printed circuit board 10 adjacent to the first surface 11a other than the soldered portion 40a and the contact portions 50a.

Figure 3:
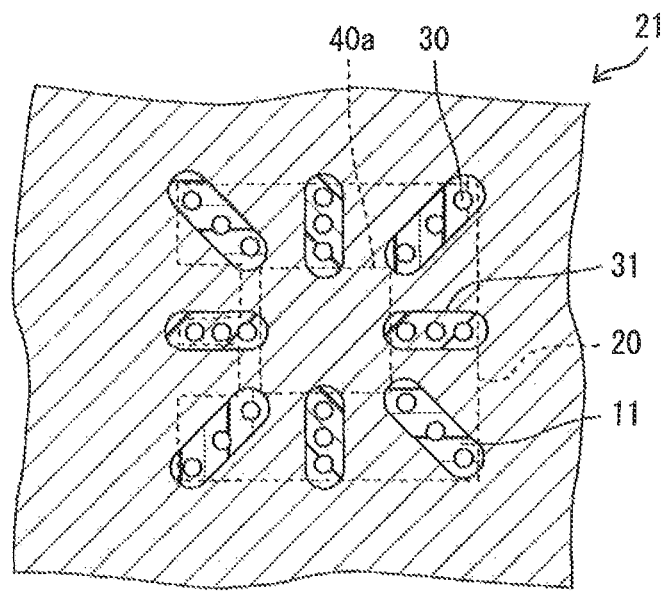
FIG. 3 is a cross-sectional view of the multilayer printed circuit board taken along line III-III in FIG. 2.

The internal layer conductor 21 is disposed on the circuit layer next to the circuit layer on which the first electrode 20 is disposed. The internal layer conductor 21 overlaps the whole area of the first electrode 20. In other words, an outer periphery of the first electrode 20 is located inside an outer periphery of the internal layer conductor 21. The internal layer conductor 21 has an electric potential different from an electric potential the first electrode 20. In the present embodiment, as described above, the first electrode 20 is coupled with the rear electrode 120 of the electronic component 100. Thus, the first electrode 20 has a positive potential with respect to the ground potential. On the other hand, the internal layer conductor 21 is at the ground potential of the multilayer printed circuit board 10. An area of a surface of the internal layer conductor 21 being perpendicular to the thickness direction is not limited. In the present embodiment, the area of the internal layer conductor 21 is larger than the areas of the first electrode 20, the heat releasing conductor 22, and the third electrode 23 as an example. As shown in FIG. 3, the internal layer conductor 21 defines through holes 31 at portions where the connection vias 30 are inserted so as to be insulated from the first electrode 20. The through holes 31 are filled with the insulating base material. The internal layer conductor 21 is insulated from the first electrode 20 by the through holes 31. In the present embodiment, the through holes 31 are arranged in a radial manner centering on the soldered portion 40a in a plane perpendicular to the thickness direction.

The heat releasing conductor 22 is disposed on the circuit layer next to the circuit layer on which the internal layer conductor 21 is disposed and opposite from the circuit layer on which the first electrode 20 is disposed. The heat releasing conductor 22 overlaps the whole area of the first electrode 20. In other words, the outer periphery of the first electrode 20 is located inside the outer periphery of the heat releasing conductor 22. An area of a surface of the heat releasing conductor 22 being perpendicular to the thickness direction is not limited. In the present embodiment, the area of the heat releasing conductor 22 is larger than the area of the first electrode 20 as an example. As shown in FIG. 2, the heat releasing conductor 22 is electrically coupled with the first electrode 20 through the connection vies 30 so that heat can be transferred between the heat releasing conductor 22 and the first electrode 20 through the connection vies 30.

The third electrode 23 is disposed on the circuit layer exposed from the second surface 11b of the insulating substrate 11. The third electrode 23 has the surface exposed from the second surface 11b. As shown in FIG. 2, the third electrode 23 is electrically coupled with the first electrode 20 through the connection vies 30 so that heat can be transferred between the first electrode 20 and the third electrode 23 through the connection vias 30. The area of the surface of the third electrode 23 being perpendicular to the thickness direction is not limited. The area of the surface of the third electrode 23 can be set optionally based on a dimension of a component disposed on the second surface 11b and the usage condition. In the present embodiment, the area of the third electrode 23 is same as the area of the first electrode 20 as an example.

As shown in FIG. 2, the connection vias 30 electrically and thermally couple the first electrode 20, the heat releasing conductor 22, and the third electrode 23. Thus, the connection vias 30 can transfer heat among the first electrode 20, the heat releasing conductor 22, and the third electrode 23. The connection vies 30 in the present embodiment are through holes filled with copper. In the present embodiment, as shown in FIG. 3, the connection vias 30 are inserted in the through holes 31 defined by the internal layer conductor 21 and are insulated from the internal layer conductor 21 by the insulating base material that fills the through holes 31. In the present embodiment, the connection vias 30 are arranged in a radial manner centering on the soldered portion 40a.

Figure 4:
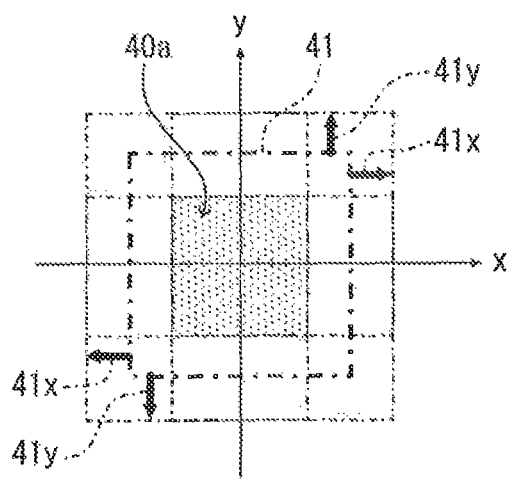
FIG. 4 is a diagram showing a soldered portion.

In the present application, as shown in FIG. 4, the soldered portion 40a means a region where a predetermined terminal of the electronic component 100 (e.g., the rear electrode 120 in the present embodiment) and the solder 40 are always in contact with the first electrode 20 even when variations (41x, 41y) of a fixed region is considered with respect to an ideal fixed area 41 (designed value) where the electronic component 100 is fixed to the first electrode 20 with the solder 40. In the words, even when the fixed region of the rear electrode 120 of the electronic component 100 is misaligned in such a manner that a margin 41x in an x-direction and a margin 41y in a y-direction are the maximum with respect to the x-direction and the y-direction, which are perpendicular to each other in a plane perpendicular to the thickness direction of the first electrode 20, the rear electrode 120 of the electronic component 100 and the solder 40 are always in contact with the first electrode 20 at the soldered portion 40a.

Next, advantages of the multilayer printed circuit board 10 according to the present embodiment will be described.

The electronic component 100 is mounted on the surface 20a of the first electrode 20 through the solder 40. Thus, heat generated from the electronic component 100 is easily transferred to the first electrode 20. Because the first electrode 20 is exposed outside from the first surface 11a of the insulating substrate 11, the first electrode 20 can easily release heat transferred from the electronic component 100. The first electrode 20 has the depressions 20b at the outer peripheral portion in the plane perpendicular to the thickness direction. The second electrodes 50 extend from outside the first electrode 20 to inside the depressions 20b. Thus, regardless of lengths of the leads 130, the electronic component 100 can be mounted in the vicinity of a center of the first electrode 20. In other words, the soldered portion 40a can be set in the vicinity of the first electrode 20. Thus, in the first electrode 20, heat generated from the electronic component 100 can be uniformly dispersed in a radial manner. Thus, the first electrode 20 can easily release heat to outside and can easily release heat to the heat releasing conductor 22 and the third electrode 23 coupled through the connection vias 30.

On the circuit layer next to the first electrode 20, the internal layer conductor 21 is disposed. The circuit layer next to the circuit layer on which the first electrode 20 is disposed can easily transfer heat stored in the first electrode compared with other circuit layers. Thus, heat generated from the first electrode 20 can be easily transferred to the internal layer conductor 21 through the insulating substrate 11. The heat transferred to the internal layer conductor 21 is dispersed over the whole area of the internal layer conductor 21 and is released to the insulating substrate 11. The internal layer conductor 21 in the present embodiment overlaps the soldered portion 40a. In the insulating substrate 11, a portion just under the soldered portion 40a is likely to store heat. Thus, by disposing the internal layer conductor 21 just under the soldered portion 40a, heat can be transferred to the internal layer conductor 21 more efficiently, and the heat releasing performance can be improved.

The heat releasing conductor 22 is disposed on the circuit layer next to the circuit layer on which the internal layer conductor 21 is disposed and opposite from the first electrode 20. Because the heat releasing conductor 22 is coupled with the first electrode 20 through the connection vias 30, the heat generated from the electronic component 100 is easily transferred. In other words, a heat capacity of a conductor coupled with the electronic component 100 increases compared with a case in which only the first electrode 20 is disposed. Accordingly, the heat generated from the electronic component 100 can be released more efficiently. Also a surface area of the conductor coupled with the electronic component 100 increases compared with the case in which only the first electrode 20 is disposed. Accordingly, the heat generated from the electronic component 100 can be released more efficiently. In addition, in the present embodiment, the internal layer conductor 21 is disposed between the first electrode 20 and the heat releasing conductor 22. In this structure, an opposing area of the conductor coupled with the electronic component 100 and opposite through the internal layer conductor 21 and the insulating substrate 11 increase by the area of the heat releasing conductor 22 compared with the case in which the conductor includes only the first electrode 20. Thus, the heat transferred from the electronic component 100 to the first electrode 20 and the heat releasing conductor 22 can be transferred to the internal layer conductor 21 more efficiently, and the heat releasing performance can be improved. In the present embodiment, in the plane perpendicular to the thickness direction, the area of the heat releasing conductor 22 is larger than the area of the first electrode 20. Thus, the heat releasing performance to the internal layer conductor 21 can be improved without increasing the area of the first electrode 20.

In the present embodiment, the third electrode 23 is disposed on the circuit layer exposed from the second surface 11b of the insulating substrate 11 opposite from the first surface 11a. The third electrode 23 is coupled with the first electrode 20 through the connection vies 30, and the surface of the third electrode 23 is exposed outside from the second surface 11b. Thus, the third electrode 23 can receive the heat generated from the electronic component 100 and stored in the first electrode 20 and can release the heat from a side adjacent to the second surface 11b to outside.

In the present embodiment, the connection vies 30 are arranged in the radial manner centering on the soldered portion 40a. By this configuration, the through holes 31 in the internal layer conductor 21 are also arranged in the radial manner. Accordingly, the heat can be transferred substantially uniformly in the radial manner without interrupting a heat transfer path that spreads out from the soldered portion 40a. In addition, the heat generated from the electronic component 100 and stored in the first electrode 20 can be uniformly transferred to the heat releasing conductor 22 and the third electrode 23 in the radial manner through the connection vies 30. Accordingly, in opposing areas of the internal layer conductor 21 and the heat releasing conductor 22 through the insulating substrate 11, a temperature difference between the internal layer conductor 21 and the heat releasing conductor 22 can be provided in a large area, and the heat releasing performance from the heat releasing conductor 22 to the internal layer conductor 21 can be improved. Furthermore, in a large area in the third electrode 23, a temperature difference between the third electrode 23 and outside can be provided, and the heat releasing performance from the third electrode 23 to outside can be improved.

As described above, the heat capacity of the conductor that stores the heat generated from the electronic component 100 can be increased by adding not only the first electrode 20 but also the heat releasing conductor 22 and the third electrode 23 as the conductor coupled with the electronic component 100. In addition, the opposing area through the internal layer conductor 21 and the insulating substrate 11 can be increased with increasing the surface area of the conducto. Thus, the heat releasing performance from the first electrode 20 and the heat releasing conductor 22 to the insulating substrate 11 can be improved, and the heat transfer performance to the internal layer conductor 21 can be improved. Thus, the heat releasing performance can be improved without increasing the area of the first electrode 20.

As described above, because the heat releasing performance can be improved without increasing the area of the first electrode 20, for example, a transistor, which functions as a variable resistor, in a series regulator power circuit used for a vehicle and the like can be mounted as the electronic component 100 on the multilayer printed circuit board 10.

Second Embodiment

Figure 5:
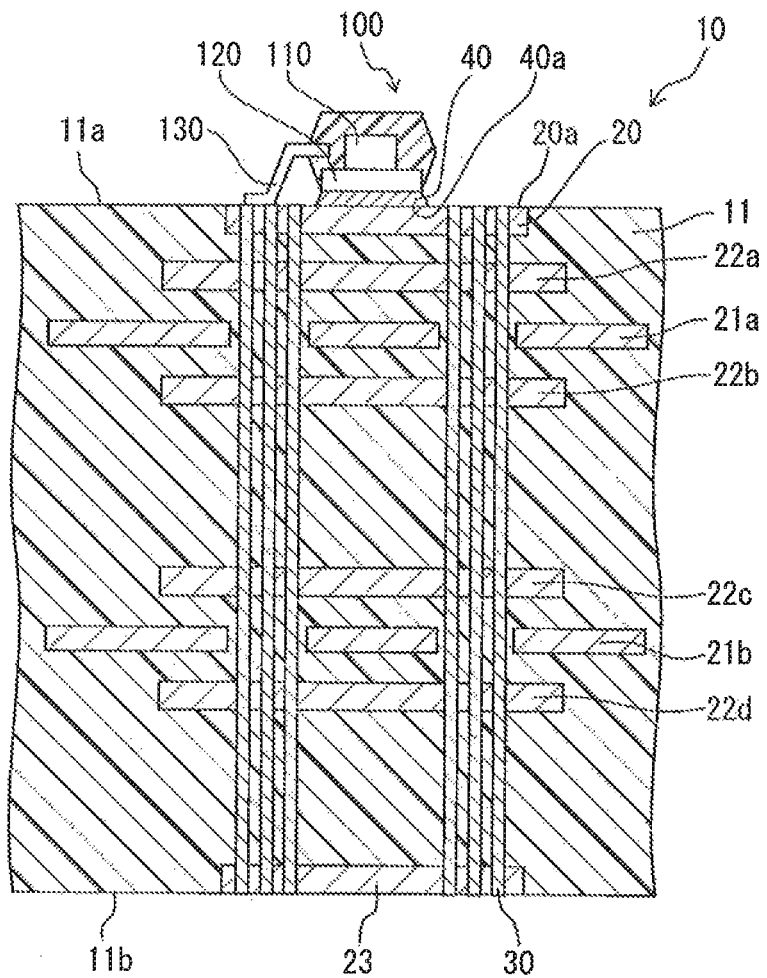
FIG. 5 is a cross-sectional view of a multilayer printed circuit board according to a second embodiment of the present disclosure.

A multilayer printed circuit board 10 according to a second embodiment of the present disclosure will be described with reference to FIG. 5. In the first embodiment, the internal layer conductor 21 is disposed on the circuit layer next to the circuit layer on which the first electrode 20 is disposed. On the other hand, in the present embodiment, as shown in FIG. 5, a heat releasing conductor 22a is disposed on a circuit layer next to the circuit layer on which the first electrode 20 is disposed, and an internal layer conductor 21a is disposed between the heat releasing conductor 22a and a heat releasing conductor 22b that is disposed on a circuit layer different from the circuit layer on which the heat releasing conductor 22a is disposed.

The internal layer conductors 21a, 21b are disposed on different circuit layers, the internal conductor layer 21a is disposed between the heat releasing conductors 22a, 22b, and the internal layer conductor 21b is disposed between the heat releasing conductors 22c, 22d.

The heat releasing conductor 22a is disposed on the circuit layer next to the circuit layer on which the first electrode 20 is disposed. An area of the heat releasing conductor 22a is larger than the area of the first electrode 20 and the heat releasing conductor 22a overlaps the whole area of the first electrode 20. In other words, an outer periphery of the heat releasing conductor 22a is located outside the outer periphery of the first electrode 20. The internal layer conductor 21a is disposed on the circuit layer next to the heat releasing conductor 22a and opposite from the first electrode 20. The internal layer conductor 21a overlaps the whole area of the first electrode 20. In other words, an outer periphery of the internal layer conductor 21a is located outside the outer periphery of the first electrode 20. Furthermore, the heat releasing conductor 22b is disposed on a circuit layer next to the internal layer conductor 21a and opposite from the heat releasing conductor 22a. In the present embodiment, the heat releasing conductor 22b has the same shape with the heat releasing conductor 22a and overlaps the whole area of the heat releasing conductor 22a. In other words, the internal layer conductor 21a is disposed between the heat releasing conductor 22a and the heat releasing conductor 22b, and the heat releasing conductor 22a is disposed on the circuit layer next to the first electrode 20.

Furthermore, in the present embodiment, the internal layer conductor 21b is disposed in the insulating substrate 11 in addition to the internal layer conductor 21a. The internal layer conductor 21b may have any shape. In the present embodiment, the internal layer conductor 21b has the same shape as the internal layer conductor 21a. The heat releasing conductor 22c and the heat releasing conductor 22d are disposed on circuit layers next to the circuit layer on which the internal layer conductor 21b is disposed. The heat releasing conductors 22c, 22d have the same shape as the heat releasing conductors 22a, 22b. The heat releasing conductors 22c, 22d overlap each other over the whole area.

In a manner similar to the first embodiment, the third electrode 23 is disposed on the circuit layer exposed from the second surface 11b of the insulating substrate 11 opposite from the first surface 11a. The third electrode 23 has the surface exposed from the second surface 11b.

The first electrode 20, the heat releasing conductors 22a, 22b, 22c, 22d, and the third electrode 23 are electrically coupled through the connection vias 30 formed by filling through holes with copper so that heat can be transferred among the first electrode 20, the heat releasing conductors 22a, 22b, 22c, 22d, and the third electrode 23 through the connection vias 30. The internal layer conductors 21a, 21b define through holes 31 in which the connection vias 30 are inserted in a manner similar to the first embodiment (see FIG. 3).

On the surface 20a of the first electrode 20, the electronic component 100 is mounted in a manner similar to the first embodiment.

Next, advantages of the multilayer printed circuit board 10 according to the present embodiment will be described.

In the present embodiment, the first electrode 20 on which the electronic component 100 is mounted is electrically coupled with the heat releasing conductors 22a, 22b, 22c, 22d, and the third electrode 23 through the connection vias 30 so that heat can be transferred. Thus, a heat capacity of a conductor coupled with the electronic component 100 can be increased compared with a case in which the conductor coupled with the electronic component 100 includes only the first electrode 20, and the heat generated from the electronic component 100 can be released more efficiently. In addition, a surface area of the conductor coupled with the electronic component 100 can be increased, and the heat generated from the electronic component 100 can be transferred and released to the insulating substrate 11 more efficiently. Furthermore, in the present embodiment, the internal layer conductor 21a is disposed between the heat releasing conductor 22a, 22b having a larger area than the first electrode 20. Thus, the opposing area of the conductor coupled with the electronic component 100 and being opposite to the internal layer conductor 21a through the insulating substrate 11 can be increased compared with the case in which the conductor coupled with the electronic component 100 includes only the first electrode 20. Furthermore, the opposing area can be increased compared with the case in which the conductor coupled with the electronic component 100 includes the first electrode 20 and the heat releasing conductor 22 as described in the first embodiment. Thus, heat can be transferred from the heat releasing conductors 22a, 22b to the internal layer conductor 21a efficiently. Therefore, the heat releasing performance of heat generated from the electronic component 100 can be improved without increasing the area of the first electrode 20.

Furthermore, in the multilayer printed circuit board 10 according to the present embodiment, the internal layer conductor 21a is disposed between the heat releasing conductors 22a, 22b, and the internal layer conductor 21b is disposed between the heat releasing conductors 22c, 22d. Accordingly, the heat transferred to the heat releasing conductors 22c, 22d through the connection vies can be transferred to the internal layer conductor 21b, and the heat can be released from the internal layer conductor 21b to the insulating substrate 11. In other words, the internal layer conductor 21b away from the first electrode 20 more than the internal layer conductor 21a can be used for releasing the heat generated from the electronic component 100.

Third Embodiment

A multilayer printed circuit board according to a third embodiment of the present disclosure will be described with reference to FIG. 6 and FIG. 7. In each of the above-described embodiments, the connection vias 30 are electrically and thermally coupled with one another through the first electrode 20, the heat releasing conductor 22 and the third electrode 23. In the present embodiment, the connection vias 30 are coupled with one another also on the circuit layer in the insulating substrate 11 other than the circuit layer on which the heat releasing conductor 22 is disposed.

Figure 6:
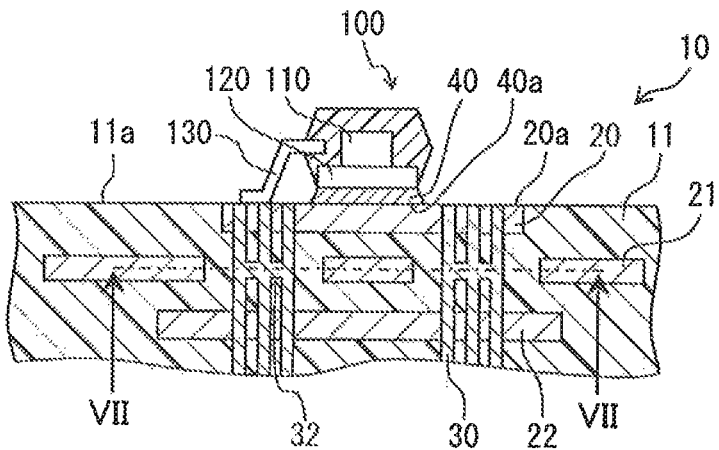
FIG. 6 is a cross-sectional view of a multilayer printed circuit board according to a third embodiment of the present disclosure.
Figure 7:
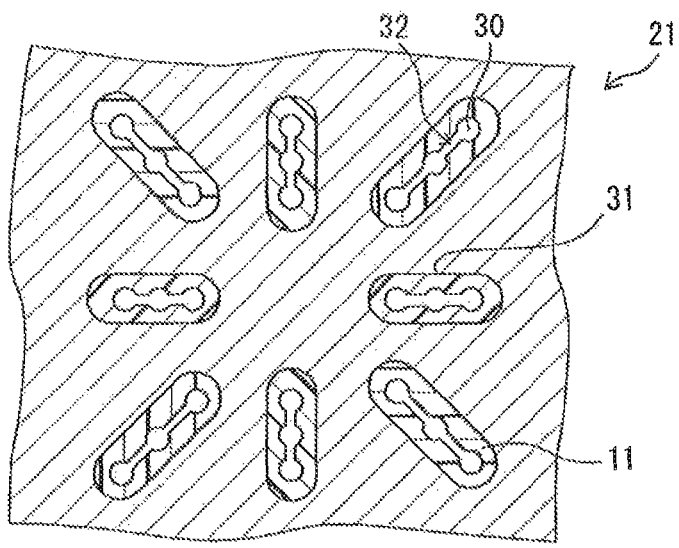
FIG. 7 is a cross-sectional view of the multilayer printed circuit board taken along line VII-VII in FIG. 6.

In the present embodiment, as shown in FIG. 6, on the circuit layer on which the internal layer conductor 21 is disposed, the connection vies 30 are coupled with one another through bypass conductors 32. In this configuration, as shown in FIG. 7, the connection vias 30 on the circuit layer on which the internal layer conductor 21 is disposed are coupled with one another through the bypass conductors 32.

Accordingly, a heat transfer path from the first electrode 20 to the heat releasing conductor 22 can be easily secured, and a bias of a temperature distribution in the heat releasing conductor 22 can be restricted. Therefore, heat can be efficiently transferred from the first electrode 20 and the heating releasing conductor 22 to the internal layer conductor 21.

In the present embodiment, the bypass conductors 32 are disposed on the circuit layer on which the internal layer conductor 21 is disposed as an example. Positions of the bypass conductors 32 are not limited to the above-described example. For example, the bypass conductors 32 may also be disposed on the circuit layer on which the internal layer conductor 21 and the heat releasing conductor 22 are not disposed.

Fourth Embodiment

A multilayer printed circuit board 10 according to a fourth embodiment of the present disclosure will be described with reference to FIG. 8. In each of the above-described embodiments, the connection vies 30 are through holes filled with copper.

Figure 8:
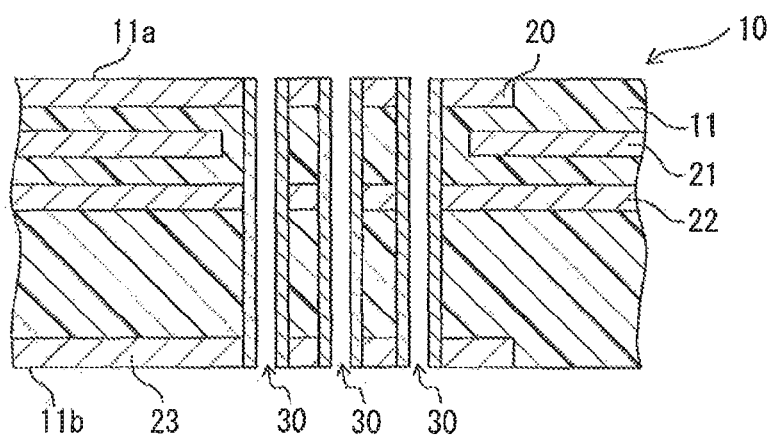
FIG. 8 is a cross-sectional view of a multilayer printed circuit board according to a fourth embodiment of the present disclosure.

In the present embodiment, as shown in FIG. 8, inner walls of connection vies 30 coupling the first electrode 20, the heat releasing conductor 22, and the third electrode 23 are coated with conductor, such as copper. In other words, the connection vies 30 are hollow vias in which only the inner walls are plated with copper.

Accordingly, the first electrode 20 and the heat releasing conductor 22 are electrically coupled as to enable a heat transfer between the first electrode 20 and the heat releasing conductor 22, and the heat transferred through the connection vias 30 can be released also to air in the connection vias 30. Thus, the heat stored in the first electrode 20 and the heat releasing conductor 22 can be released efficiently.

Other Embodiments

While the present disclosure has been described with reference to embodiments thereof, it is to be understood that the disclosure is not limited to the embodiments and constructions. The present disclosure is intended to cover various modification and equivalent arrangements.

Figure 9:
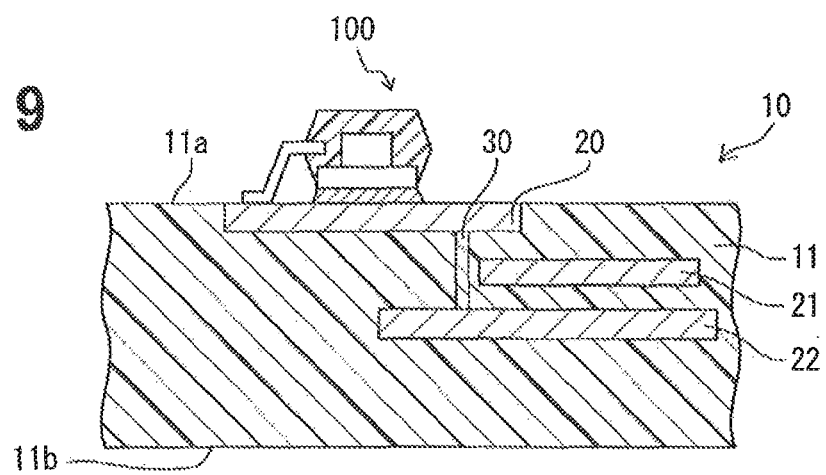
FIG. 9 is a cross-sectional view of a multilayer printed circuit board according to another embodiment of the present disclosure.

For example, as shown in FIG. 9, the internal layer conductor 21 does not have to overlap the whole area of the first electrode 20 and only has to overlap at least a part of the first electrode 20. The internal layer conductor 21 may overlap the soldered portion 40a which is likely to receive the heat generated from the electronic component 100. The internal layer conductor 21 does not have to define the through holes 31 and the connection vias 30 do not have to penetrate the internal layer conductor 21 as shown in FIG. 9.

Also the heat releasing conductor 22 does not have to overlap the whole area of the first electrode 20 and only has to be coupled with the first electrode 20 through the connection vias 30 and to overlap at least a part of the internal layer conductor 21. In a manner similar to the internal layer conductor 21, the heat releasing conductor 22 may overlap the soldered portion 40a.

In each of the above-described embodiments, the connection vias 30 are through holes penetrating through the insulating substrate 11. However, the connection vias 30 are not limited to the through hole vias. For example, the connection vias 30 may also be interlayer connection vias that couples different layers (in FIG. 9, the first electrode 20 and the heat releasing conductor 22).

In each of the above-described embodiments, the third electrode 23 is disposed on the circuit layer exposed from the second surface 11b of the insulating substrate 11. As shown in FIG. 9, the third electrode 23 may be omitted. Whether disposing the third electrode 23 or not may be determined based on mounting ratio of components on the second surface 11b or usage conditions of the multilayer printed circuit board 10.

Figure 10:
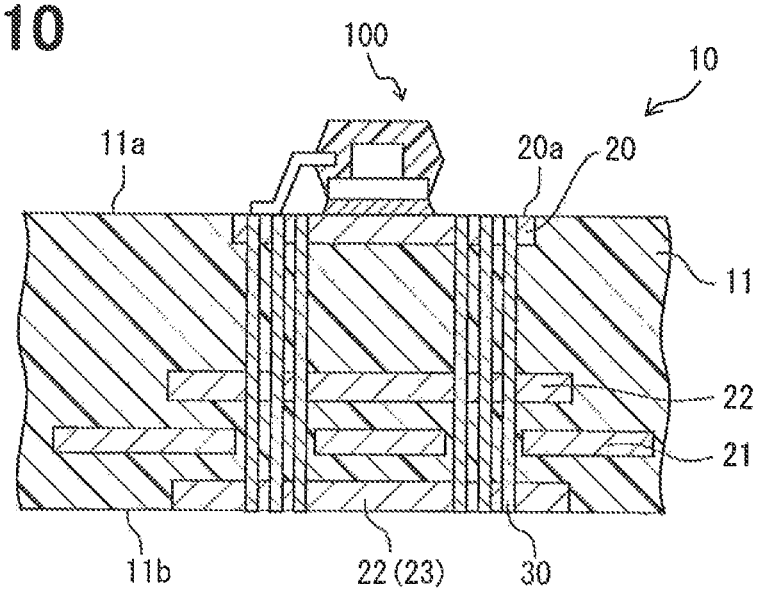
FIG. 10 is a cross-sectional view of a multilayer printed circuit board according to another embodiment of the present disclosure.

As shown in FIG. 10, the heat releasing conductor 22 may be disposed on the circuit layer next to the circuit layer on which the internal layer conductor 21 is disposed, and the circuit layer on which the heat releasing conductor 22 is disposed may be exposed from the second surface 11b of the insulating substrate 11. In this configuration, the heat releasing conductor 22 exposed from the second surface 11b can be regarded as the third electrode 23, and the heat releasing conductor 22 can transfer the heat transferred from the first electrode 20 to the internal layer conductor 21 and can release the heat from a side adjacent to the second surface 11b to outside.

Figure 11:
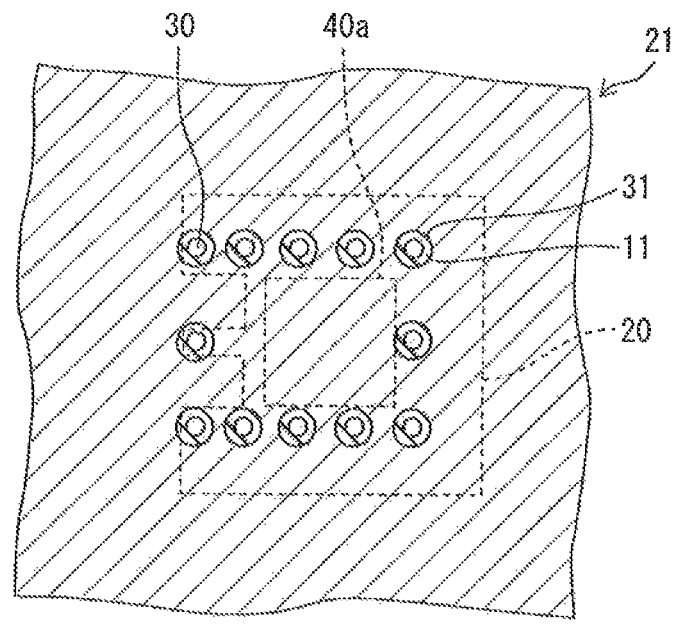
FIG. 11 is a diagram showing an internal layer conductor in a multilayer printed circuit board according to another embodiment of the present disclosure.

In each of the above-described embodiments, the connection vias 30 are disposed in the radial manner centering on the soldered portion 40a. The arrangement of the connection vies 30 is not limited to the above-described example and may be set optionally. As shown in FIG. 11, the connection vias 30 only have to couple the first electrode 20 and the heat releasing conductor 22 electrically so as to enable a heat transfer between the first electrode 20 and the heat releasing conductor 22.

In each of the above-described embodiments, copper is used as material for forming the first electrode 20, the internal layer conductor 21, the heat releasing conductor 22, the third electrode 23, and the connection vias 30. The material for forming the above-described components may also be other material having a high thermal conductivity. For example, the material may include aluminum and gold.

In each of the above-described embodiments, the first electrode 20 has the depressions 20b at the outer peripheral portion. However, the first electrode does not have to have the depressions 20b. When the first electrode 20 has the depressions 20b at the outer peripheral portion, the electronic component 100 can be mounted in the vicinity of the center of the first electrode 20, and the heat can be transferred in the radial manner substantially uniformly from the soldered portion 40a.

In each of the above-described embodiments, the insulating substrate 11 is made of prepreg as an example. The insulating substrate 11 may also be made of other material such as thermoplastic resin and ceramic.

What is claimed is:

1. A multilayer printed circuit board comprising:
   an insulating substrate made of an insulating base material and having a first surface and a second surface opposite to each other;
   a plurality of circuit layers arranged in the insulating substrate in a thickness direction of the insulating substrate;
   an electronic component including a terminal;
   an electrode disposed on one of the circuit layers exposed from the first surface of the insulating substrate, the electrode including a soldered portion at which the terminal of the electronic component is soldered;
   an internal layer conductor disposed on one of the circuit layers located inside the insulating substrate, the internal layer conductor having an electric potential different from an electric potential of the electrode, the internal layer conductor overlapping a part of the electrode, the internal layer conductor defining a plurality of through holes in a radial manner centering on the soldered portion in a plane perpendicular to the thickness direction;
   a heat releasing conductor disposed on one of the circuit layers next to the circuit layer on which the internal layer conductor is disposed, the circuit layer on which the heat releasing conductor is disposed being different from the circuit layer on which the electrode is disposed, the heat releasing conductor overlapping a part of the internal layer conductor; and
   a plurality of connection vias inserted in the through holes through the insulating base material, and coupling the electrode and the heat releasing conductor so as to enable a heat transfer between the electrode and the heat releasing conductor,
   wherein the internal layer conductor and the heat releasing conductor overlap a whole area of the soldered portion of the electrode.

2. The multilayer printed circuit board according to claim 1,
   wherein the circuit layer on which the internal layer conductor is disposed is located next to the circuit layer on which the electrode is disposed and between the circuit layer on which the electrode is disposed and the circuit layer on which the heat releasing conductor is disposed.

3. The multilayer printed circuit board according to claim 1,
   wherein, in the plane perpendicular to the thickness direction, an overlapped area of the heat releasing conductor and the internal layer conductor is larger than an overlapped area of the electrode and the internal layer conductor.

4. The multilayer printed circuit board according to claim 3, further comprising
   another heat releasing conductor disposed on one of the circuit layers next to the circuit layer on which the internal layer conductor is disposed,
   wherein the circuit layer on which the internal layer conductor is disposed is located between the circuit layer on which the heat releasing conductor is disposed and the circuit layer on which the another heat releasing conductor is disposed.

5. The multilayer printed circuit board according to claim 1, further comprising
   a bypass conductor coupling one of the connection vias with another of the connection vias on one of the circuit layers that is located inside the insulating substrate and is different from the circuit layer on which the heat releasing conductor is disposed, so as to enable a heat transfer between the one of the connection vias and the another of the connection vias.

6. The multilayer printed circuit board according to claim 1, further comprising
   another electrode including a contact portion,
   wherein the electronic component further includes another terminal coupled with the contact portion of the another electrode,
   wherein the electrode defines a depression at an outer peripheral portion in the plane perpendicular to the thickness direction, and
   wherein the contact portion of the another electrode is disposed inside the depression of the electrode.

7. The multilayer printed circuit board according to claim 1, further comprising
   another electrode disposed on one of the circuit layers exposed from the second surface of the insulating substrate,
   wherein the connection vias coupling the electrode and the another electrode so as to enable a heat transfer between the electrode and the another electrode, and
   wherein the heat releasing conductor is disposed inside the insulating substrate.

8. The multilayer printed circuit board according to claim 1,
   wherein each of the connection vias is a hollow via in which a hole is defined by the insulating substrate and a conductive material is disposed on an inner wall of the hole.

* * * * *